(12) United States Patent
Azize

(10) Patent No.: US 11,302,835 B2
(45) Date of Patent: *Apr. 12, 2022

(54) SEMICONDUCTOR PHOTODETECTOR ASSEMBLY

(71) Applicant: Analog Devices, Inc., Norwood, MA (US)

(72) Inventor: Mohamed Azize, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/710,801

(22) Filed: Dec. 11, 2019

(65) Prior Publication Data

US 2020/0220036 A1    Jul. 9, 2020

Related U.S. Application Data

(60) Provisional application No. 62/789,829, filed on Jan. 8, 2019.

(51) Int. Cl.
H01L 29/15 (2006.01)
H01L 31/0256 (2006.01)
H01L 31/0304 (2006.01)
H01L 31/0352 (2006.01)
H01L 31/0224 (2006.01)
H01L 31/0232 (2014.01)
(Continued)

(52) U.S. Cl.
CPC .. H01L 31/03048 (2013.01); H01L 31/02327 (2013.01); H01L 31/022408 (2013.01); H01L 31/035272 (2013.01); H01L 31/109 (2013.01); H01L 31/1123 (2013.01); H01L 31/1848 (2013.01)

(58) Field of Classification Search
CPC ....... H01L 31/03048; H01L 31/022408; H01L 31/02327; H01L 31/035272; H01L 31/109; H01L 31/1123; H01L 31/1848
USPC .......................................................... 257/76
See application file for complete search history.

(56) References Cited

U.S. PATENT DOCUMENTS 4,739,385 A    4/1988 Bethea et al.
6,252,287 B1   6/2001 Kurtz et al.
(Continued)

FOREIGN PATENT DOCUMENTS

CN    1516292 A    7/2004
CN    1757161 A    4/2006
(Continued)

OTHER PUBLICATIONS

"International Application Serial No. PCT/US2019/066329, International Search Report dated Feb. 18, 2020", 4 pgs.
(Continued)

Primary Examiner — Calvin Y Choi
(74) Attorney, Agent, or Firm — Schwegman Lundberg & Woessner, P.A.

(57) ABSTRACT

Techniques to use energy band gap engineering (or band offset engineering) to produce a photodetector semiconductor assembly that can be tuned to absorb light in one or more wavelengths. For example, the assembly can be tuned to receive infrared (IR) and/or ultraviolet (UV) light. The photodetector assembly can operate as a photodiode, a phototransistor, or can include both a photodiode and a phototransistor.

20 Claims, 5 Drawing Sheets

(51) Int. Cl.
*H01L 31/112* (2006.01)
*H01L 31/18* (2006.01)
*H01L 31/109* (2006.01)

(56) References Cited

U.S. PATENT DOCUMENTS

| | | |
|---|---|---|
| 6,326,654 B1 | 12/2001 | Ruden et al. |
| 6,586,272 B1 | 7/2003 | Song |
| 6,720,589 B1 | 4/2004 | Shields |
| 6,849,882 B2 | 2/2005 | Chavarkar et al. |
| 7,112,860 B2 | 9/2006 | Saxler |
| 7,705,415 B1 | 4/2010 | Nabet |
| 8,269,223 B2 | 9/2012 | Wraback et al. |
| 9,747,752 B2 | 8/2017 | Homer |
| 10,199,525 B2 | 2/2019 | Nada et al. |
| 10,447,261 B1 | 10/2019 | Hughes et al. |
| 2002/0011642 A1 | 1/2002 | Dries et al. |
| 2008/0128745 A1* | 6/2008 | Mastro ............... H01L 31/1812 257/184 |
| 2009/0159123 A1 | 6/2009 | Kothari et al. |
| 2014/0070272 A1* | 3/2014 | Knigge ........... H01L 31/035209 257/184 |
| 2016/0190298 A1* | 6/2016 | Wu ................ H01L 29/2003 257/76 |
| 2016/0300973 A1 | 10/2016 | Shen et al. |
| 2017/0258376 A1 | 9/2017 | Ram et al. |
| 2019/0115459 A1 | 4/2019 | Kim |
| 2019/0140120 A1 | 5/2019 | Ma et al. |
| 2019/0140128 A1 | 5/2019 | Harmon |
| 2019/0165032 A1 | 5/2019 | Fiorenza et al. |
| 2019/0187105 A1 | 6/2019 | Ram et al. |
| 2020/0203549 A1 | 6/2020 | Azize |

FOREIGN PATENT DOCUMENTS

| | | |
|---|---|---|
| CN | 207320147 U | 5/2018 |
| CN | 109065663 A | 12/2018 |
| GB | 2352087 A | 1/2001 |
| JP | 2010056504 A | 3/2010 |
| JP | 2010056508 | 3/2010 |
| JP | 4635187 B2 | 12/2010 |
| KR | 20170010578 A | 2/2017 |
| WO | 2015131846 | 9/2015 |
| WO | 2020131637 | 6/2020 |
| WO | 2020146093 | 7/2020 |

OTHER PUBLICATIONS

"International Application Serial No. PCT/US2019/066329, Written Opinion dated Feb. 18, 2020", 7 pgs.
"International Application Serial No. PCT/US2019/066338, International Search Report dated Feb. 18, 2020", 4 pgs.
"International Application Serial No. PCT/US2019/066338, Written Opinion dated Feb. 18, 2020", 7 pgs.
Khan, Fasihullah, "Oxygen desorption kinetics of ZnO nanorod-gated AlGaN GaN HEMT-based UV photodetectors", AIP Advances, vol. 8, No. 7, American Institute of Physics, New York, (Jul. 27, 2018), 14 pgs.
Alpert, Hannah S., et al., "Gallium Nitride Photodetector Measurements of UV Emission from a Gaseous CH4/O2 Hybrid Rocket Igniter Plume", IEEE Aerospace Conference, (2019), 7 pgs.
Chang, S.J., "Nitride-based 2DEG photodetectors with a large AC responsivity", Solid-State Electronics, 47(11), (2003), 2023-2026.
Huang, Y., "Photocurrent characteristics of two-dimensional-electron-gas-based AlGaN/GaN metal-semiconductor-metal photodetectors", Applied Physics Letters, 96(24), (2010), 4 pgs.
Satterthwaite, Peter F., et al., "High Responsivity, Low Dark Current Ultraviolet Photodetectors Based on Two-Dimensional Electron Gas Interdigitated Transducers", ACS Photonics, Article ASAP, URL: https://pubs.acs.org/doi/abs/10.1021/acsphotonics.8b01169, (Oct. 2018), 6 pgs.
Zaidi, Zaffar, "Applications of GaN HFETs in UV detection and Power electronics", Doctorate Thesis in Electronics and Electrical Engineering at the University of Sheffield, UK, (Nov. 2014), 169 pgs.
"U.S. Appl. No. 16/579,428, Final Office Action dated Mar. 11, 2021", 11 pgs.
"U.S. Appl. No. 16/579,428, Non Final Office Action dated Oct. 29, 2020", 12 pgs.
"U.S. Appl. No. 16/579,428, Response filed Jan. 5, 2021 to Non Final Office Action dated Oct. 29, 2020", 12 pgs.
U.S. Appl. No. 16/579,428, filed Sep. 23, 2019, Hybrid Semiconductor Photodetector Assembly.
"U.S. Appl. No. 16/579,428, Response filed May 11, 2021 to Final Office Action dated Mar. 11, 2021", 13 pgs.
"U.S. Appl. No. 16/579,428, Advisory Action dated May 20, 2021", 3 pgs.
"International Application Serial No. PCT/US2019/066338, International Preliminary Report on Patentability dated Jul. 1, 2021", 9 pgs.
"U.S. Appl. No. 16/579,428, Non Final Office Action dated Jul. 8, 2021", 15 pgs.
"International Application Serial No. PCT/US2019/066329, International Preliminary Report on Patentability dated Jul. 22, 2021", 9 pgs.
"U.S. Appl. No. 16/579,428, Response filed Sep. 23, 2021 to Non Final Office Action dated Jul. 8, 2021", 14 pgs.
"U.S. Appl. No. 16/579,428, Examiner Interview Summary dated Nov. 24, 2021", 2 pgs.

* cited by examiner

SEMICONDUCTOR PHOTODETECTOR ASSEMBLY

CLAIM OF PRIORITY

This application claims the benefit of priority of U.S. Provisional Patent Application Ser. No. 62/789,829, titled "SEMICONDUCTOR PHOTODETECTOR ASSEMBLY" to Mohamed Azize, filed on Jan. 8, 2019, the entire contents of which being incorporated herein by reference.

FIELD OF THE DISCLOSURE

This document pertains generally, but not by way of limitation, to photodetector assemblies and methods.

BACKGROUND

A photodiode is typically a PN junction or PIN structure. When a photon of sufficient energy strikes the diode, it can create an electron-hole pair. This mechanism is also known as the inner photoelectric effect. If the absorption occurs in the junction's depletion region, or one diffusion length away from it, these carriers are swept from the junction by the built-in electric field of the depletion region. Thus, holes move toward the anode, and electrons move toward the cathode, and a photocurrent is produced.

When used in zero bias or photovoltaic mode, the flow of photocurrent out of the device is restricted and a voltage builds up. When used in photoconductive mode, the diode is often reverse-biased (with the cathode driven positive with respect to the anode). This can reduce the response time because the additional reverse bias can increase the width of the depletion layer, which can decrease the junction's capacitance. The reverse bias also increases the dark current without much change in the photocurrent. For a given spectral distribution, the photocurrent is linearly proportional to the illuminance (and to the irradiance).

SUMMARY OF THE DISCLOSURE

This disclosure describes, among other things, techniques to use energy band gap engineering (or band offset engineering) to produce a photodetector semiconductor assembly that can be tuned to absorb light in one or more wavelengths. For example, the assembly can be tuned to receive infrared (IR) and/or ultraviolet (UV) light.

The photodetector assembly can operate as a photodiode, a phototransistor, or can include both a photodiode and a phototransistor. The photodetector described in this disclosure can reduce the cost factor of conventional InGaAs photodetectors by more than ten while maintaining high performance for SWIR applications such as LIDAR.

In some aspects, this disclosure is directed to a dual UV/IR band semiconductor photodetector assembly configured to operate in response to light received at one or more input wavelengths, the assembly comprising: a semiconductor absorber layer material configured to receive the light at the one or more input wavelengths and generate carriers via presence of an electric field, the semiconductor absorber layer material including multiple wide band gap semiconductor layers; and a wide band gap semiconductor transducer layer material coupled to the absorber layer material, the transducer layer material configured to collect the carriers from the absorber layer material and form a continuous two-dimensional electron gas (2DEG) channel.

In some aspects, this disclosure is directed to a method of forming a dual UV/IR band semiconductor photodetector assembly configured to receive light at one or more wavelengths, the method comprising: coupling a wide band gap semiconductor transducer layer material to a substrate material, the transducer layer material configured to collect electrons from the absorber layer material and form a continuous two-dimensional electron gas (2DEG) channel between two contacts; and coupling a semiconductor absorber layer material to the wide band gap semiconductor transducer layer material, the semiconductor absorber layer material configured to receive the light at the one or more input wavelengths and generate electron-hole pairs, the semiconductor absorber layer material including multiple wide band gap semiconductor layers.

In some aspects, this disclosure is directed to a dual/IR band semiconductor photodetector assembly configured to operate in response to light received at one or more input wavelengths, the assembly comprising: means for receiving the light at the one or more input wavelengths and generate carriers via presence of an electric field, the means for receiving including multiple wide band gap semiconductor layers; and means for collecting carriers from the means for receiving, the means for collecting coupled to the means for receiving, wherein the means for collecting is configured to form a continuous two-dimensional electron gas (2DEG) channel.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
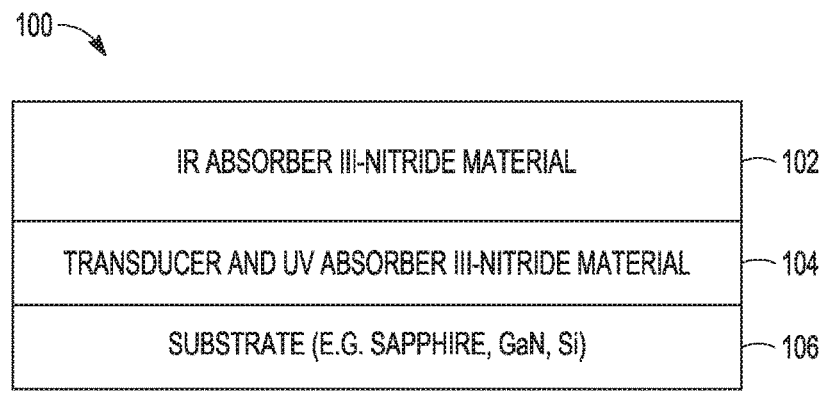
FIG. 1 is a conceptual diagram depicting an example of a structure of a semiconductor photodetector assembly in accordance with various techniques of this disclosure.

Photodetectors can be combined into image sensing devices, such as focal plane arrays (FPAs), and used in numerous automobile, space, and military applications. For example, one application includes remote sensing using light pulses emitted for example by lasers and reflected by distant objects can be referred to as LIAR (light detection and ranging). A LIDAR receiver can include an optical receiver having a photodiode (PD) as a receiving element, and a transimpedance amplifier (TIA), for example a shunt-feedback amplifier, which converts the photocurrent from the receiving photodiode into a voltage.

LIDAR systems can use short-wave infrared light (SWIR), such as wavelengths greater than about 1 micrometer ($\mu m$) to about 3 $\mu m$. In these applications, conventional photodetectors use indium gallium arsenide (InGaAs), photodiode (PDs) for achieving high performance at a wavelength of about 1.5 $\mu m$. However, the high cost of InGaAs PDs have delayed their adoption in different consumer markets, e.g. automobile, electronics consumers, etc.

The present inventor has recognized a need for an inexpensive photodetector assembly that can provide high performance in SWIR applications, such as LIDAR, for example. This disclosure describes techniques to use energy band gap engineering (or band offset engineering) to produce a photodetector semiconductor assembly that can be tuned to absorb light in one or more wavelengths. For example, the assembly can be tuned to receive infrared (IR) and/or ultraviolet (UV) light.

The photodetector assembly can operate as a photodiode, a phototransistor, or can include both a photodiode and a phototransistor. The photodetector described in this disclosure can reduce the cost factor of conventional InGaAs photodetectors by more than ten while maintaining high performance for SWIR applications such as LIDAR.

The semiconductor photodetector device structure can include an absorber layer and a transducer layer. The absorber layer can have multiple wide band gap semiconductor layers and can be configured to receive light at the one or more input wavelengths and generate electron-hole pairs. For example, the absorber layer can be tuned to receive infrared (IR) and/or ultraviolet (UV) light.

In addition, the photodetector device structure can include a wide band gap semiconductor transducer layer material coupled to the absorber layer material. The transducer layer material can be configured to collect electrons from the absorber layer material and form a two-dimensional electron gas (2DEG) channel. After shining light, e.g., IR or/and UV light, onto the absorber layer material, the photo-generated electron-hole pairs or/and pump electrons from the well layers can be collected by the transducer structure as photocurrent in the photo-voltaic mode.

The photodetector assembly can be considered a phototransistor (a type of photodetector having a conductor channel with an optically controlled gate), photoconductor, a metal-semiconductor-metal (MSM), or a photodiode, e.g., a Schottky diode or PIN diode. The photodetector can be operated in photo-voltaic mode (e.g., no bias) or in photo-conductive mode (e.g., by using a bias) to achieve higher performance.

FIG. 1 is a conceptual diagram depicting an example of a structure of a semiconductor photodetector assembly 100 in accordance with various techniques of this disclosure. An absorber layer material 102 can include multiple wide band gap semiconductor layers and can be configured to receive light at the one or more input wavelengths and generate electron-hole pairs. For example, the absorber layer material 102 can absorb one or more input wavelengths that include IR light and/or UV light and can convert the absorbed light into excitons, e.g., electron-hole pairs. In some example implementations, the absorber layer material 102 can absorb one or more input wavelengths that include wavelengths in the UV range, e.g., about 260-360 nanometers (nm), and/or in the IR range, e.g., about 1.3-14 $\mu m$.

As mentioned above, the absorber layer material 102 can include multiple wide band gap semiconductor layers. For example, the absorber layer material 102 can include multiple doped and undoped wide-band gap layers. The base scheme of the absorber layer material 102 can be a tri-layer semiconductor such as the following:

Undoped (u) or n or p-GaN (emitter layer)/$Al_yGa_{1-y}N$ (barrier layer)/undoped or n-GaN (collector layer).

Figure 6:
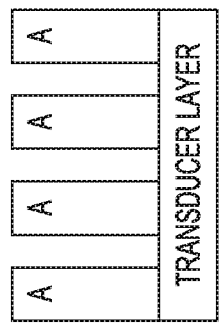
FIG. 6 is a cross-sectional view of an example of an absorber layer arranged in bi-dimensional layers and coupled with a transducer layer.
Figure 7:
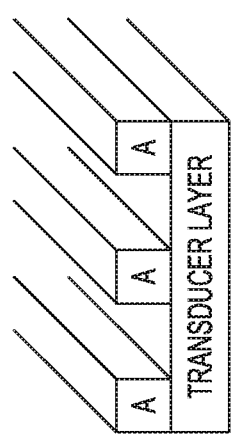
FIG. 7 is a cross-sectional view of an example of an absorber layer arranged in nanoribbons and coupled with a transducer layer.
Figure 8:
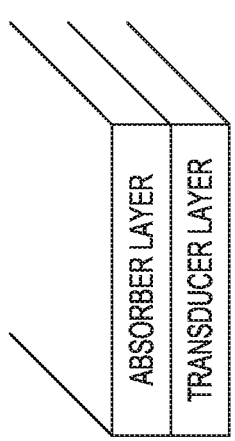
FIG. 8 is a cross-sectional view of an example of an absorber layer arranged in nanowires and coupled with a transducer layer.

The absorber layer 102 can be composed of bi-dimensional GaN/AlGaN/GaN layers, GaN/AlGaN/GaN nanoribbons, or GaN/AlGaN/GaN nanowires, examples of which being shown in cross-section in FIGS. 6-8, respectively. In some examples, the topmost nGaN layers can be formed in a nanoribbon-like shape or nanowire-like shape. The absorber layer 102 can include a passivation layer, such as, but not limited to, $SiO_2$, SiN, or $Al_2O_3$ to reduce a surface recombination rate. A top layer forming a flat lens can be formed on the top of nGaN layer or on the top of the passivation layers.

As indicated above, the absorber layer 102 can include a first layer of n-type gallium nitride (GaN) acting as an emitter layer, a second layer of aluminum gallium nitride ($Al_yGa_{1-y}N$) acting as a barrier layer, and a third layer of n-type GaN acting as a collector layer. In some example configurations, the absorber layer 102 can include one or more tri-layer configurations, e.g., between 1 and 200, stacked on top of one another.

The first layer (GaN) of the absorber layer 102 can be an electron emitter layer followed by a second layer ($Al_yGa_{1-y}N$) of the absorber layer 102, e.g., barrier layer, that has wider band gap energy than the first layer to confine electron in the emitter layer. The third layer (GaN) of the absorber layer 102 can be a collector layer to collect the photo-emitted electrons from the first layer, e.g., emitter layer. The band offset energy difference (e.g., energy $E_1$) between the emitter and the barrier layers can be varied from 0 electron volts (eV) to 3 eV (e.g., to cover the UV-IR range, for example).

Without being bound by theory, the principle of operation of the photodetector is now described. When photons with an energy (e.g., energy $E_2$) hit the tri-layer semiconductor material of the absorber layer 102, where the energy $E_2$ is greater than the energy $E_1$ (the band offset energy difference between the emitter and the barrier layers) then electrons can be photo-emitted across the barrier layer and collected by the collector layer. The modulation of the energy between the emitter and barrier layer is called band offset engineering. Band offset engineering can be used to change the energy difference, e.g., energy $E_1$, between the first layer and the second layer of the absorber layer 102. For SWIR applications, the band offset energy difference $E_1$ between the emitter and the barrier layer can be in the range of about 0 eV to about 1.8 eV, for example.

In configurations where the absorber layer 102 includes more than one tri-layer configuration, band offset engineering can be used to change the energy difference, e.g., energy $E_1$, between the first layer and the second layer of the absorber layer 102 of various corresponding ones of the tri-layer configuration so that one tri-layer configuration could have a different energy $E_1$ than another tri-layer configuration of the absorber layer 102. Based on the different energies, different wavelengths of light can be absorbed or rejected, as desired.

The semiconductor assembly 100 of this disclosure can be a multiple monolithically integrated photodetector and can be photo-sensitive from UV to IR, for example. As an example, the assembly 100 can be used for flame detection where UV and IR photo-detectors are needed.

In some example configurations, at least one of the wide band gap semiconductor layers of the absorber layer can further include indium (In). By adding indium to one or more of the wide band gap semiconductor layers of the absorber layer 102, the band gap of the absorber layer 102 can be tuned or adjusted to be sensitive to particular wavelengths or ranges of wavelengths of light, such as being more sensitive to IR. For example, another base scheme of the absorber layer material 102 can be a tri-layer semiconductor such as the following:

1. undoped or n or p-$In_xGa_{1-x}N$ (emitter layer)/$In_yAl_yGa_{1-x-y}N$ (barrier layer)/undoped or n or p-$In_xGa_{1-x}N$ (collector layer);
2. undoped or n or p-$In_xAl_{1-x}N$ (emitter layer)/$In_yAl_yGa_{1-x-y}N$ (barrier layer)/undoped or n or p-$In_xAl_{1-x}N$ (collector layer); or
3. undoped or n or p-ZnO/ZnMgO/undoped or n or p-ZnO The absorber layer material 102 can be deposited on a wide band gap semiconductor transducer layer material 104 coupled to the absorber layer material 102. The wide band gap semiconductor transducer layer material 104 can be a nitride material, for example, and can include one or more nitride material layers, such as AlGaN and GaN (and AlN and InAlN). Both AlGaN and GaN are wide band gap materials, e.g., about 3.4 electron volts (eV) to about 6.2 eV. The band gap of AlGaN can be adjusted by adjusting the content of the aluminum. The band gap of InAlN can be adjusted by adjusting the content of the indium.

The term "couple" in this disclosure should not be interpreted as being limited only to direct connections between two components, devices, or materials (or "elements" collectively) can also refer to an indirect relationship in which two elements are separated by one or more intermediary elements such that a path exists between the two elements which includes the intermediary element(s).

The wide band gap semiconductor transducer layer material 104 can operate as transducer. For example, the wide band gap semiconductor transducer layer material 104 can collect photo-electrons from the absorber layer material 102 at the AlGaN/GaN interface as a two-dimensional electron gas (2DEG) due to a combination of an internal electric field present in the wide-band gap semiconductor and due to the favorable energy band alignment between the absorber and wide-band gap material layers. The 2DEG may form a conductive channel of electrons that may be controllably depleted, such as by gate voltage metal contact disposed above the channel, to control a current through the semiconductor assembly.

In an example implementation, the semiconductor assembly may be a field effect transistor, such as a high electron mobility transistor (HEMT), having source and drain terminals electrically coupled to a channel formed by a 2DEG, and a gate terminal disposed above the channel. A voltage on the gate terminal, determined relative to a voltage on the drain terminal, may induce an electric field into the channel to control the concentration of free electrons in the 2DEG, such as to control a flow of current through the transistor. The wide band gap semiconductor transducer layer material 104 can be deposited on a substrate 106, e.g., sapphire, silicon (Si), SiC, AlN or GaN.

The photodetector assembly 100 can be used either in photo-voltaic mode (e.g., no bias) or photo-conductive mode (e.g., with bias). The photodetector assembly 100 can respond very quickly because the collection of the photo-carriers is done by using the 2DEG conductance, e.g., high mobility. In addition, the dark current can be very low because the material used is a wide-band gap material. The photo-current can be high due to the high mobility of the photo-carrier using the 2DEG channel.

Figure 2:
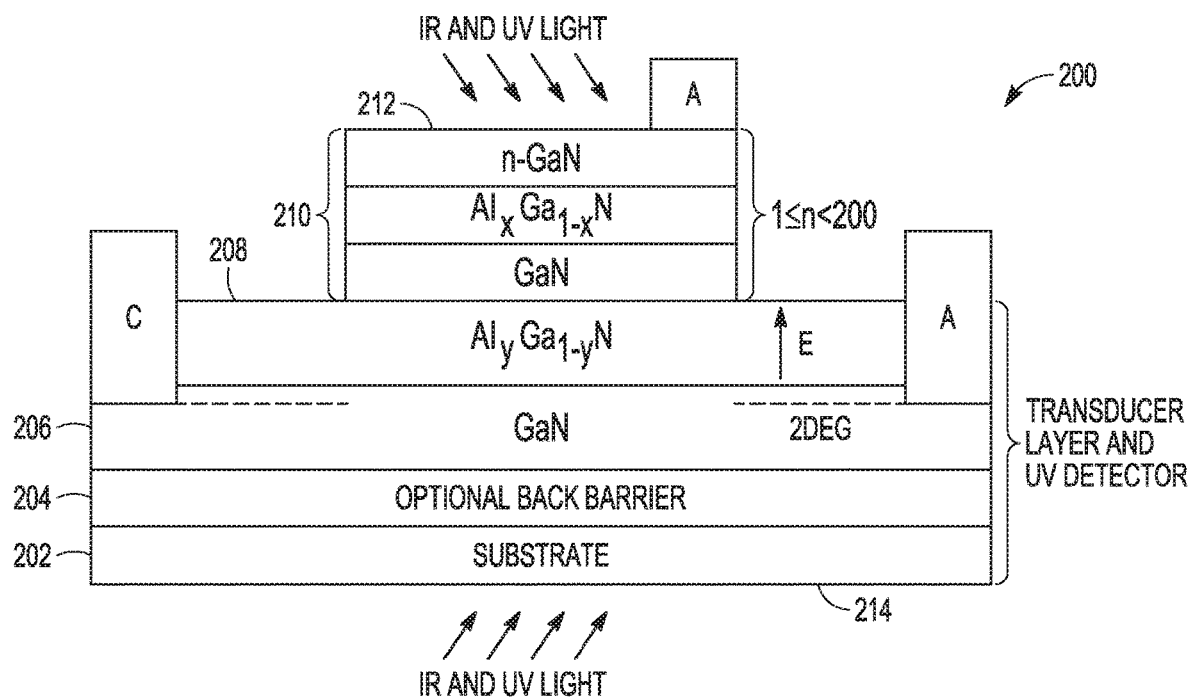
FIG. 2 is an example of a cross-sectional view of a semiconductor photodetector assembly in accordance with various techniques of this disclosure.

FIG. 2 is an example of cross-sectional view of a semiconductor photodetector assembly 200 in accordance with various techniques of this disclosure. The photodetector assembly 200 can be considered to be a phototransistor (a type of photodetector having a conductor channel with an optically controlled gate), photoconductor, a metal-semiconductor-metal (MSM), or a photodiode, e.g., a Schottky diode or PIN diode. The assembly 200 can include a substrate layer 202, e.g., sapphire, silicon (Si), or GaN.

In some example configurations, the assembly can include an optional back barrier layer 204 over the substrate layer 202. In some examples, the optional back barrier layer can include aluminum nitride.

Over the substrate layer 206 (or over the optional back barrier layer 204 in such configurations), one or more wide band gap semiconductor transducer layer materials can be deposited or otherwise coupled. For example, a GaN first transducer layer 206 can be deposited over the substrate layer 202 (or the back barrier layer 204), and an $Al_yGa_{(1-y)}N$ second transducer layer 208 can be deposited over the GaN first transducer layer 206. In the example configuration shown in FIG. 2, the aluminum content ("Y") can be 1% and the gallium content ("1-Y") can be 99%.

In other examples, the aluminum content can be increased, and the gallium content can be correspondingly decreased. Adjusting the aluminum content and its layer thickness can modulate the strength of the electric field E in the AlGaN/GaN layer. For example, aluminum content of about 30% with a thickness greater than 2 nanometers (nm) can result in electrons in the GaN channel layer, whereas an aluminum content of about 15% with a thickness of 2 nm or less can result in no presence of electrons in the GaN channel layer. The techniques of this disclosure can be used with an aluminum content of 0% and 100% to modulate the electron concentration in the GaN channel layer localized at the AlGaN/GaN interface.

Over the one or more wide band gap semiconductor transducer layer materials, e.g., over the GaN layer 206 and the $Al_yGa_{(1-y)}N$ layer 208, an absorber layer material 210 can be deposited. As described above with respect to FIG. 1, the absorber layer material can include multiple wide band gap semiconductor layers. For example, the absorber layer material 210 can include multiple doped and undoped wide-band gap layers. In some examples, the absorber layer material 210 can include gallium arsenide and the transducer layer material(s) do not include gallium arsenide.

The layers of the absorber layer material 210 can have a thickness between about 0.25 nm and about 200 nm. In some examples, the thickness of the layers of the absorber layer material 210 can vary such that at least two layers have different thicknesses. The layers of the absorber layer material 210 can be intrinsically or extrinsically doped and can be n-type, p-type, or a mix of both n-type and p-type. In some examples, the doping levels can be about $5 \times 10^{17}$ cm$^3$ to about $9 \times 10^{20}$ cm$^3$.

In some examples, the base scheme of the absorber layer material 210 can be a tri-layer semiconductor such as the following:

Undoped or n or p-GaN (emitter layer)/Al$_y$Ga$_{1-y}$N (barrier layer)/undoped or n or p-GaN (collector layer).

Another base scheme of the absorber layer material 210 can be a tri-layer semiconductor that includes indium in one or more of its layers, such as the following:

Undoped or n or p-In$_x$Ga$_{1-x}$N (emitter layer)/In$_x$Al$_y$Ga$_{1-x-y}$N (barrier layer)/undoped or n or p-In$_x$Ga$_{1-x}$N (collector layer); or Undoped or n or p-In$_x$Al$_{1-x}$N (emitter layer)/In$_x$Al$_y$Ga$_{1-x-y}$N (barrier layer)/undoped or n or p-In$_x$Al$_{1-x}$N (collector layer).

In some example implementations, the indium content ("X") can be about 50% and the gallium content ("1-X") can be about 50%. By using an indium content of about 50% and the gallium content of about 50%, a band gap of about 0.7 eV can result, which can be used for wavelengths around 1.5 μm. The percentages can be varied to configure the assembly to operate at wavelengths greater than 1.5 μm or less than 1.5 μm. In this manner, the tri-layer semiconductor material can be tuned to receive infrared (IR) and/or ultraviolet (UV) light, for example. As indicated above, multiple tri-layer configurations, e.g., between 1 and 200 configurations, can be stacked on top of one another such a first tri-layer configuration can be tuned to a first wavelength range, a second tri-layer configuration can be tuned to a second wavelength range, and so forth.

As seen in FIG. 2, a 2DEG channel can be formed at the AlGaN/GaN interface due to a combination of the internal electric field E present in the wide-band gap semiconductor and due to the favorable energy band alignment between the absorber and wide-band gap material layers allowing the transfer of photo-carriers into the GaN channel.

FIG. 2 represents the structure before illumination. As seen in FIG. 2, the 2DEG channel does not extend under the absorber layer 210 in the GaN layer 206 before illumination.

One or more contacts can be formed on the assembly 200. A first contact material C (cathode) can be formed at the interface between the first transducer layer material 206 and the second transducer layer 208, e.g., the AlGaN/GaN interface. A second contact material A (anode), spaced apart from the first contact material C, can be to the interface between the first transducer layer material 206 and the second transducer layer 208. The contacts C and A can be Schottky or ohmic contacts by directly contacting the 2DEG. Optionally, a third contact material A (anode) can be formed on the absorber layer material 210, e.g., on the undoped or n or p-GaN material (emitter layer).

As seen in FIG. 2, the assembly 200 can be illuminated from the top 212 or the bottom 214 with light, e.g., UV and IR light. For example, the assembly 200 can act as an IR and UV photodetector when illuminated from top 212. As described above, the absorber layer can be tuned to receive one or more wavelengths of light.

When illuminated from the bottom 214, the assembly 200 can block one or more wavelengths. For example, silicon can be transparent to IR above about 1 eV. Thus, by using a substrate 202 that includes silicon, the substrate 202 can act as a filter to block UV and pass IR, for example. A substrate 202 that includes sapphire can be transparent to both IR and UV light, for example.

Figure 3:
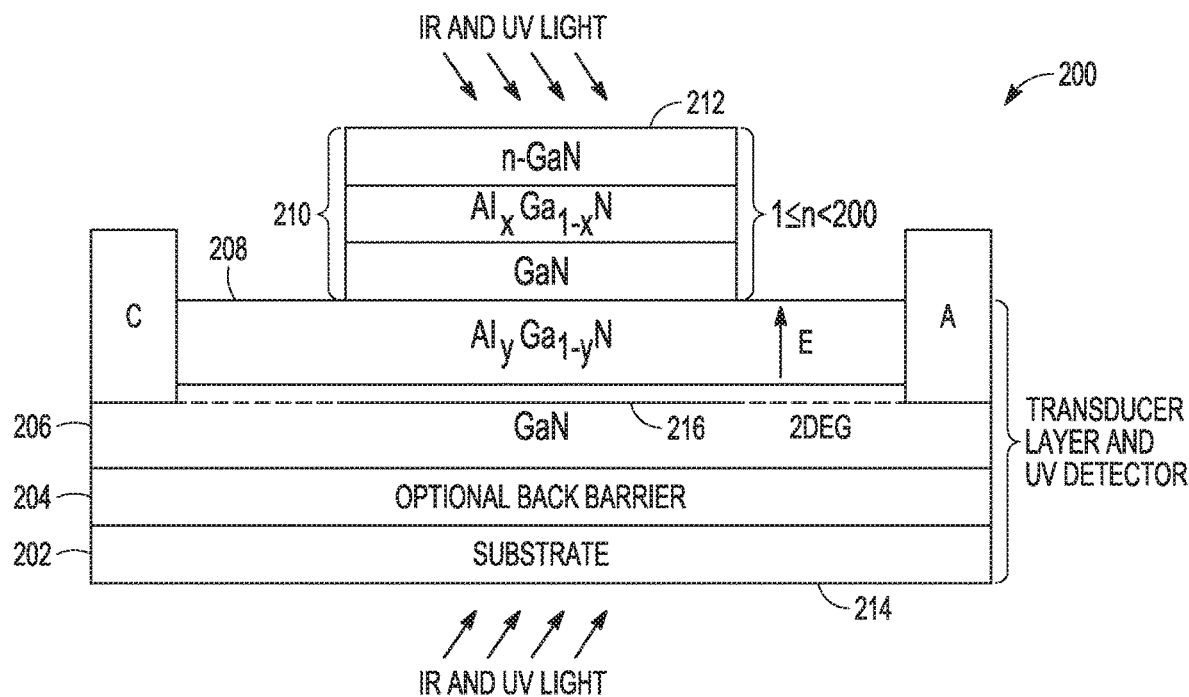
FIG. 3 is an example of the semiconductor photodetector assembly of FIG. 2 after illumination.

FIG. 3 is an example of the semiconductor photodetector assembly 200 of FIG. 2 after illumination. As seen in FIG. 3, carriers, such as electrons 216, can be photo-emitted from the emitter layer into the 2DEG channel at the AlGaN/GaN interface after illumination of the assembly 200, e.g., after IR and/or UV illumination, and cascade to the transducer layer via the presence of the electric field E to form a continuous 2DEG channel between the two contacts C and A. The carriers, e.g., electrons 216, can be collected and converted to current in the 2DEG channel.

Figure 4:
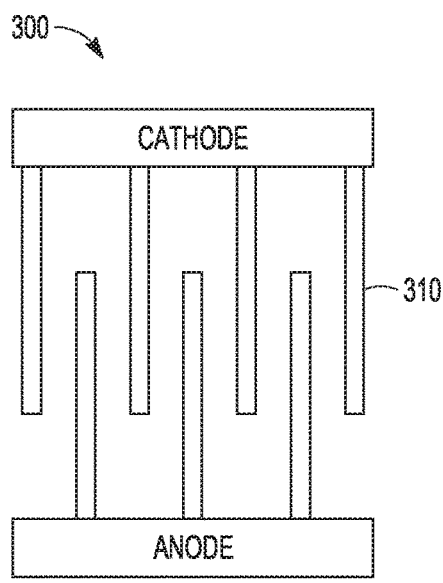
FIG. 4 is a plan view of an example of a metal-semiconductor-metal (MSM) photodetector assembly.

FIG. 4 is a plan view of an example of a metal-semiconductor-metal (MSM) photodetector assembly. In the example configuration shown in FIG. 4, the assembly 300 can include a plurality of fingers 310, e.g., made of semiconductor material, positioned with the 2DEG channel, e.g., at the AlGaN/GaN interface of FIGS. 2 and 3. Each finger 310 can extend partially from one of the first contact, e.g., cathode, and the second contact, e.g., anode, to the other of the first contact and the second contact. In the example shown, the fingers 310 are interdigitated.

A signal can be detected at the end of the fingers 310. Including multiple fingers 310 can help amplify the signal between the first and second contacts. In one approach, the fingers 310 can be coated with a metal to reduce the series resistance and thus the voltage drop across each finger. The metal on top of the semi-conductor material, however, can reflect the incident light, which can reduce the absorption of light and thus the efficiency of the photodetector.

In another approach, rather than use metal fingers that can reflect a portion of the received light, one or more of the fingers 310 can utilize the 2DEG channel as buried semi-metal. By using a buried semi-metal layer to form the fingers 310 instead of using a metal on the top surface of a semiconductor, the surface area for detection can be increased and thus improve the absorption of light. An example of an approach is described in "High Responsivity, Low Dark Current Ultraviolet Photodetectors Based on Two-Dimensional Electron Gas Interdigitated Transducers," by Peter Satterthwaite, et al., ACS Photonics, published Oct. 1, 2018, the entire contents being incorporated herein by reference.

Figure 5:
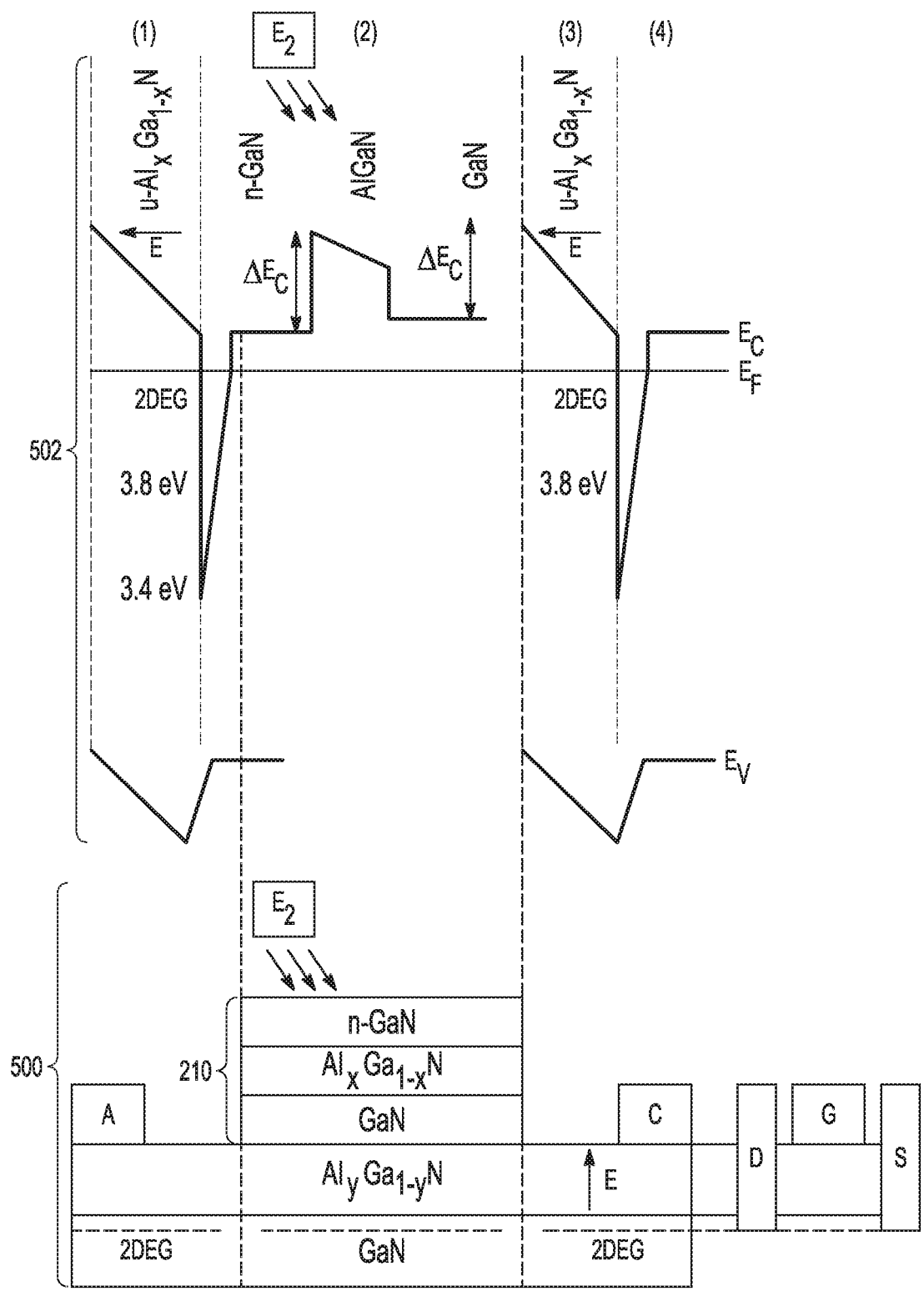
FIG. 5 is a conceptual diagram depicting a relationship between a cross-sectional view of a semiconductor assembly and a corresponding energy band diagram of the semiconductor assembly.

FIG. 5 is a conceptual diagram depicting a relationship between a cross-sectional view of a semiconductor assembly and a corresponding energy band diagram of the semiconductor assembly. The semiconductor assembly is shown at 500 and the energy band diagram is shown at 502. In particular, FIG. 5 depicts the mechanism of photodetection in the semiconductor photodetector assembly 500 at a 0V bias.

The photodetector assembly 500, e.g., a photodiode MSM PD, can receive incident light, e.g., IR and/or UV light. In particular, the absorber layer material 210 can receive the incident light with energy $E_2$. In response to the incident light and when the energy $E_2$ is greater than or equal to an energy $E_1$ (the band offset energy $\Delta E_C$), electron-hole pairs can be generated in the n-GaN layer. The electrons generated in the n-GaN layer can then be injected by the internal electric field E into the 2DEG channel localized at the interface between the Al$_y$Ga$_{(1-y)}$N layer and the GaN layer before being collected by the cathode C, e.g., an ohmic contact. A photocurrent measurement can be taken between the anode A and the cathode C.

As seen in FIG. 5, there is a discontinuity in the 2DEG channel in the GaN layer that can limit the current conduction between the cathode and anode contacts in the range of femtoamps (fA) to nanoamps (nA), which can yield very low noise signal in the OFF operation of the photodetector. Furthermore, higher signal/noise ratio can then be expected due to a low noise signal.

Referring now to the energy band diagram 502, the energy band diagram 502 is divided into four portions labeled (1)-(4) that correspond from left to right to the assembly shown at 500. A conduction band edge $E_C$, a Fermi level $E_F$, and a valence band edge $E_V$ are shown in each of the three portions.

The portion (2) of the energy band diagram corresponds to the absorber layer material 210 and the transducer and substrate materials below the absorber layer. The absorber layer 210 can include an n-GaN (emitter layer), an $Al_yGa_{1-y}N$ (barrier layer), and a GaN (collector layer). In some example implementations, the absorber layer material 210 can have a band gap of about 0.7 eV that can be used for wavelengths around 1.5 μm, e.g., IR light, for example. Other band gaps can be used, and thus other wavelengths can be received by adjusting the aluminum content. For example, increasing the aluminum content can increase the band offset energy $\Delta E_C$.

When an electron in the n-GaN layer of the absorber layer 210 shown in region (2) receives energy $E_2$ from a photon where energy $E_2$ is greater than or equal to the band offset energy $\Delta E_C$, the electron will jump to the $u-Al_xGa_{(1-x)}N$ layer in region (3) of the energy band diagram, where the electric field E will collect electrons. In some examples, the aluminum content ("X") can be 1% and the gallium content ("1-X") can be 99%. In other examples, the aluminum content can be increased, and the gallium content can be correspondingly decreased. As a result of the electric field E shown in the $u-Al_xGa_{(1-x)}N$ layer in region (3) of the energy band diagram, and because electrons will tend to go to a lower energy band, any electrons in region (2) will be transported through the region (2) and will be trapped in the GaN material at the interface between the $Al_yGa_{(1-y)}N$ layer and the GaN layer before being collected by the cathode C, e.g., an ohmic contact. In some example configurations, an optional back barrier layer can be included, such as shown in FIG. 2 above.

A compound semiconductor used to form the semiconductor devices described herein may include a chemical compound of elements from different groups in the periodic table. Such chemical compounds may include a pairing of elements from group III (the group comprising boron (B), aluminum (Al), gallium (Ga), indium (In), and thallium (Tl)) with elements from group V (the group comprising nitrogen (N), phosphorus (P), arsenic (As), antimony (Sb), and bismuth (Bi)). Group 3 of the periodic table may also be referred to as Group III and group 5 as Group V.

Without limitation, a semiconductor device may be fabricated from gallium nitride (GaN) and aluminum indium gallium nitride (AlInGaN). Additionally, a semiconductor device may be fabricated using AlN/GaN/AlN hetero-structures, InAlN/GaN, GaN/AlGaN, or other combinations of group 13 and group 15 elements. These hetero-structures may form a two-dimensional electron gas (2DEG) at the interface of the compound semiconductors that form heterostructure, such as the interface of GaN and AlGaN. The 2DEG may form a conductive channel of electrons that may be controllably depleted, such as by gate voltage metal contact disposed above the channel, to control a current through the semiconductor device.

In an example, a field effect transistor, such as a high electron mobility transistor (HEMT), having source (S) and drain (D) terminals electrically coupled to a channel formed by a 2DEG, and a gate (G) terminal disposed above the channel can be formed on the same substrate to drive the photodiode. A voltage on the gate terminal, determined relative to a voltage on the drain terminal, may induce an electric field into the channel to control the concentration of free electrons in the 2DEG, such as to control a flow of current through the transistor.

FIG. 6 is a cross-sectional view of an example of an absorber layer arranged in bi-dimensional layers and coupled with a transducer layer. The absorber layer of FIG. 6 can include layers, e.g., n-GaN/AlGaN/n-GaN layers, arranged in bi-dimensional layers on a transducer layer, e.g., AlGaN/GaN transducer layer.

FIG. 7 is a cross-sectional view of an example of an absorber layer arranged in nanoribbons and coupled with a transducer layer. The absorber layers A of FIG. 7 can include nanoribbons having layers, e.g., n-GaN/AlGaN/n-GaN layers, arranged on a transducer layer, e.g., AlGaN/GaN transducer layer.

FIG. 8 is a cross-sectional view of an example of an absorber layer arranged in nanowires and coupled with a transducer layer. The absorber layers A of FIG. 8 can include nanoribbons having layers, e.g., n-GaN/AlGaN/n-GaN layers, arranged on a transducer layer, e.g., AlGaN/GaN transducer layer.

Nanowires can be oriented perpendicular to the surface of the wafer. In contrast, nanoribbons are nanowires laying on the surface of wafer. Nanoribbons have the freedom to have any orientation with respect to the transducer layer. In some examples, nanowires and/or nanoribbons can have a diameter of about 10 nm to about 10 μm, a pitch of about 50 nm to about 10 μm, and a length of about 5 nm to about 10 μm.

Figure 9:
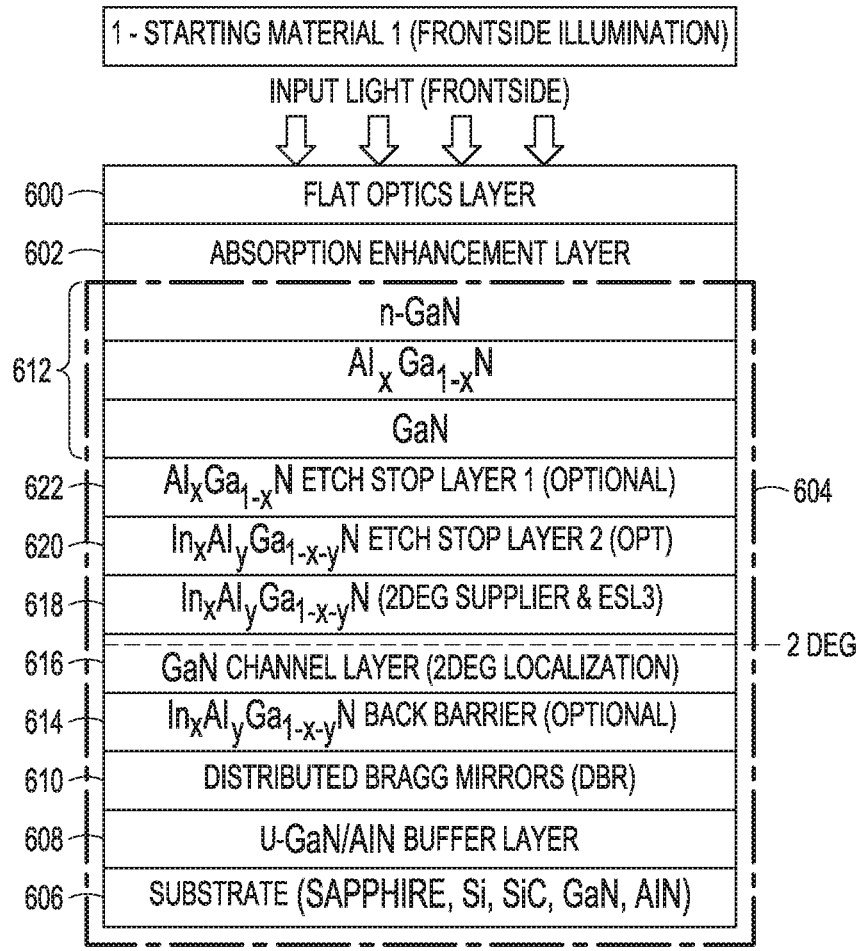
FIG. 9 is an example of a starting material that can be used in a process fabrication flow to produce an integrated semiconductor assembly in accordance with this disclosure.

FIG. 9 is an example of a starting material that can be used in a process fabrication flow to produce an integrated semiconductor assembly in accordance with this disclosure. As seen in FIG. 9, for frontside illumination, the IR photodetector, the starting material can optionally include one or both of a flat optics layer 600 and an absorption enhancement layer 602, which can improve the absorption of light at the surface. The flat optics layer 600 can include, for example, metamaterial lens material to focus the light and the absorption enhancement layer can include an anti-reflective coating, for example.

The core assembly 604 can include a substrate 606, such as sapphire, silicon (Si), silicon carbide (SiC), GaN, or aluminum nitride (AlN). A buffer layer 608, e.g., u-GaN or AlN, can be deposited over the substrate. In addition, the core assembly 604 can include a distributed Bragg reflectors or mirror (DBR) layer 610 deposited over the buffer layer. The DBR layer can include multiple layers, e.g., 2 to 100 layers, of semiconductors having different indices of refraction n (e.g., n1 layer, n2 layer, n1 layer, n2 layer, n1 layer, n2 layer . . . ) that can reflect a certain wavelength range, e.g. IR range. The DBR layer 610 can reflect light that was not absorbed by the tri-layer semiconductor 612 (including $n-GaN/Al_yGa_{1-y}N/n-GaN$) back to the tri-layer semiconductor 612, which can increase the likelihood of absorption, which can improve performance.

The core device 604 can include an optional back barrier layer 614, e.g., $In_xAl_yGa_{1-x-y}N$, deposited over the DBR layer 610. Next, a GaN channel layer 616 can be formed, e.g., on the optional back barrier layer 614, for 2DEG localization. Over the GaN channel layer 616, an $In_xAl_yGa_{1-x-y}N$ layer 618 can be formed as a 2DEG supplier and etch stop layer.

Two additional (and optional) etch stop layers can be formed over layer 618. For example, an optional $In_xAl_yGa_{1-x-y}N$ etch stop layer 620 can be formed over layer 618 and an optional $Al_xGa_{1-x}N$ etch stop layer 622 can be formed over the $In_xAl_yGa_{1-x-y}N$ etch stop layer 620. The layers 614-622 together can form an HEMT structure. On top of the HEMT structure, the tri-layer semiconductor 612 can be formed for absorption.

Additional process fabrication flow information can be similar to that shown in FIGS. 6B-6F of commonly-assigned U.S. patent application Ser. No. 16/579,428, titled HYBRID SEMICONDUCTOR PHOTODETECTOR ASSEMBLY" to Mohamed Azize and filed on Sep. 23, 2019, the entire contents of which being incorporated by reference.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventor also contemplate examples in which only those elements shown or described are provided. Moreover, the present inventor also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 CFR. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A dual UV/IR band semiconductor photodetector assembly configured to operate in response to light received at one or more input wavelengths, the assembly comprising:
a semiconductor absorber layer material configured to receive the light at the one or more input wavelengths and generate carriers via presence of an electric field, the semiconductor absorber layer material including multiple wide band gap semiconductor layers; and
a wide band gap semiconductor transducer layer material coupled to the absorber layer material, the transducer layer material having a first state and a second state, the transducer layer material having a discontinuous two-dimensional electron gas (2DEG) channel between two contacts in the first state, the transducer layer material configured to collect the carriers from the absorber layer material and form a continuous 2DEG channel between the two contacts in the second state in response to the absorber material receiving the light.

2. The assembly of claim 1, wherein the one or more input wavelengths include one or both of infrared (IR) light and ultraviolet (UV) light.

3. The assembly of claim 2, wherein the one or more input wavelengths include wavelengths of between about 250-360 nanometers and/or wavelengths of between about 1.3-14 micrometers.

4. The assembly of claim 1, wherein a first one of the wide band gap semiconductor layers of the absorber layer material includes gallium nitride and a second one of the wide band gap semiconductor layers of the absorber layer material includes aluminum gallium nitride.

5. The assembly of claim 4, wherein a third one of the wide band gap semiconductor layers of the absorber layer material includes gallium nitride.

6. The assembly of claim 5, wherein at least one of the wide band gap semiconductor layers of the absorber layer material further includes indium.

7. The assembly of claim 1, wherein the transducer layer material includes gallium nitride.

8. The assembly of claim 7, wherein the transducer layer material further includes aluminum.

9. The assembly of claim 7, wherein the transducer layer material is a first transducer layer material, the assembly further comprising:
a second transducer layer material coupled to the first transducer layer material, the second transducer layer material including gallium nitride; and
a substrate material coupled to the second transducer layer material.

10. The assembly of claim 1, wherein the absorber layer material includes gallium arsenide and the transducer layer material does not include gallium arsenide.

11. The assembly of claim 1, wherein transducer layer material is a first transducer layer material, the assembly further comprising:
a first contact material coupled to an interface between the first transducer layer material and the second transducer layer; and
a second contact material spaced apart from the first contact material, the second contact material coupled to the interface,
wherein the 2DEG channel includes a plurality of interdigitated 2DEG channels extending partially from one of the first contact material and the second contact material to the other of the first contact material and the second contact material.

12. The assembly of claim 1, wherein the photodetector assembly includes a photodiode.

13. The assembly of claim 1, wherein the photodetector assembly includes a phototransistor.

14. The assembly of claim 1, further comprising a back barrier layer material coupled between the wide band gap semiconductor transducer layer material and a substrate layer.

15. The assembly of claim 14, wherein the back barrier layer material includes aluminum nitride.

16. A method of forming a dual UV/IR band semiconductor photodetector assembly configured to receive light at one or more wavelengths, the method comprising:
coupling a wide band gap semiconductor transducer layer material to a substrate material, the transducer layer material having a first state and a second state, the transducer layer material having a discontinuous two-dimensional electron gas (2DEG) channel between two contacts in the first state; and
coupling a semiconductor absorber layer material to the wide band gap semiconductor transducer layer material, the semiconductor absorber layer material configured to receive the light at the one or more input wavelengths and generate electron-hole pairs, the semiconductor absorber layer material including multiple wide band gap semiconductor layers,
wherein the transducer layer material is configured to collect electrons from the semiconductor absorber layer material and form a continuous two-dimensional electron gas (2DEG) channel between the two contacts in response to the semiconductor absorber material receiving the light.

17. The method of claim 16, wherein a first one of the wide band gap semiconductor layers of the absorber layer material includes gallium nitride and a second one of the wide band gap semiconductor layers of the absorber layer material includes aluminum gallium nitride.

18. The method of claim 17, wherein a third one of the wide band gap semiconductor layers of the absorber layer material includes gallium nitride.

19. A dual/IR band semiconductor photodetector assembly configured to operate in response to light received at one or more input wavelengths, the assembly comprising:
means for receiving the light at the one or more input wavelengths and generate carriers via presence of an electric field, the means for receiving including multiple wide band gap semiconductor layers; and
means for collecting carriers from the means for receiving, the means for collecting coupled to the means for receiving, the means for collecting having a first state and a second state, the means for collecting having a discontinuous two-dimensional electron gas (2DEG) channel between two contacts in the first state, wherein the means for collecting is configured to form a continuous 2DEG channel between the two contacts in the second state in response to the means for receiving the light.

20. The assembly of claim 19, wherein the photodetector assembly includes one or both of a photodiode and a phototransistor.

* * * * *